(12) United States Patent (10) Patent No.: US 8,987,788 B2
McCarten (45) Date of Patent: Mar. 24, 2015

(54) METAL-STRAPPED CCD IMAGE SENSORS

(71) Applicant: Semiconductor Components Industries, LLC, Phoenix, AZ (US)

(72) Inventor: John P. McCarten, Penfield, NY (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 271 days.

(21) Appl. No.: 13/623,317

(22) Filed: Sep. 20, 2012

(65) Prior Publication Data

US 2013/0075792 A1 Mar. 28, 2013

Related U.S. Application Data

(60) Provisional application No. 61/539,088, filed on Sep. 26, 2011.

(51) Int. Cl.
*H01L 27/148* (2006.01)
(52) U.S. Cl.
CPC ................. *H01L 27/14843* (2013.01)
USPC .................... 257/231; 257/E27.159
(58) Field of Classification Search
CPC ............. H01L 27/14643; H01L 27/14831; H01L 27/14609; H01L 27/14843; H01L 27/14868; H01L 27/14601; H01L 27/14806; H01L 27/14812; H01L 27/14685; H01L 29/76833; H01L 27/14875; H01L 29/7685; H01L 31/02164; H01L 31/115
USPC ........................... 257/231, E27.159
See application file for complete search history.

(56) References Cited

U.S. PATENT DOCUMENTS

| | | |
|---|---|---|
| 4,511,914 A | 4/1985 | Remedi et al. |
| 4,525,741 A | 6/1985 | Chahal et al. |
| 4,544,939 A | 10/1985 | Kosonocky et al. |
| 4,654,683 A | 3/1987 | Anagnostopoulos et al. |
| 4,758,883 A | 7/1988 | Kawahara et al. |
| 4,951,148 A | 8/1990 | Esser et al. |
| 5,040,144 A | 8/1991 | Pelley et al. |
| 5,043,818 A | 8/1991 | Yokoyama |
| 5,157,518 A | 10/1992 | Ohtaki et al. |
| 5,256,891 A | 10/1993 | Losee et al. |
| 5,319,263 A | 6/1994 | Kannegundla et al. |
| 5,436,476 A | 7/1995 | Hynecek |
| 5,442,395 A | 8/1995 | Sekiguchi |
| 5,460,997 A | 10/1995 | Hawkins et al. |
| 5,506,429 A | 4/1996 | Tanaka et al. |
| 5,608,242 A | 3/1997 | Kamasz et al. |
| 5,608,455 A | 3/1997 | Oda |
| 5,646,427 A | 7/1997 | Smith et al. |
| 5,923,370 A | 7/1999 | Miethig et al. |
| 5,929,470 A | 7/1999 | Harada et al. |

(Continued)

FOREIGN PATENT DOCUMENTS

| | | |
|---|---|---|
| EP | 0249113 B1 | 1/1991 |
| EP | 0148642 B1 | 9/1991 |

(Continued)

OTHER PUBLICATIONS

Apr. 1, 2014 European Search Report for EP12186079.5-1552.

*Primary Examiner* — Duy T Nguyen

(57) ABSTRACT

In various embodiments, image sensors include strapping grids of vertical and horizontal strapping lines conducting phase-control signals to underlying gate conductors that control transfer of charge within the image sensor.

20 Claims, 4 Drawing Sheets

(56) References Cited

U.S. PATENT DOCUMENTS

| | | |
|---|---|---|
| 5,981,933 A | 11/1999 | Chamberlain et al. |
| 6,018,169 A | 1/2000 | Tohyama |
| 6,097,433 A * | 8/2000 | Kawai et al. ............... 348/315 |
| 6,100,552 A | 8/2000 | Ingram |
| 6,130,420 A * | 10/2000 | Tanaka et al. ............. 250/208.1 |
| 6,281,991 B1 | 8/2001 | Mori et al. |
| 6,633,058 B1 | 10/2003 | O. et al. |
| 6,741,198 B2 | 5/2004 | McIlrath |
| 6,882,022 B2 | 4/2005 | Hynecek |
| 7,105,876 B1 | 9/2006 | Kamasz et al. |
| 7,262,429 B2 | 8/2007 | Taylor |
| 7,477,783 B2 | 1/2009 | Nakayama |
| 7,585,695 B2 | 9/2009 | Nichols et al. |
| 7,633,616 B2 | 12/2009 | Hing |
| 7,683,957 B2 | 3/2010 | Takeda |
| 7,760,878 B2 | 7/2010 | Fukushima |
| 7,768,040 B2 | 8/2010 | Farnworth |
| 7,795,574 B2 | 9/2010 | Kennedy et al. |
| 8,040,416 B2 | 10/2011 | Fukuoka |
| 8,094,216 B2 | 1/2012 | Shintani |
| 8,121,392 B2 | 2/2012 | Popovich, Jr. et al. |
| 8,223,250 B2 | 7/2012 | Higuchi et al. |
| 2002/0024066 A1 | 2/2002 | Ide |
| 2002/0056860 A1 | 5/2002 | Kreider et al. |
| 2003/0071119 A1 | 4/2003 | Tsikos et al. |
| 2003/0151075 A1 | 8/2003 | Shizukuishi |
| 2005/0224842 A1 | 10/2005 | Toyama |
| 2006/0023098 A1 | 2/2006 | Graen et al. |
| 2007/0146533 A1 | 6/2007 | Yun |
| 2007/0278537 A1 | 12/2007 | Haraguchi |
| 2008/0096373 A1 | 4/2008 | Swain et al. |
| 2009/0038540 A1 | 2/2009 | Yoshida et al. |
| 2010/0039538 A1 | 2/2010 | Ikedo |
| 2011/0074659 A1 | 3/2011 | Park et al. |
| 2011/0074996 A1 | 3/2011 | Wang et al. |
| 2011/0187815 A1 | 8/2011 | Asami et al. |
| 2011/0242376 A1 | 10/2011 | Ando |
| 2012/0028403 A1 | 2/2012 | Wang |

FOREIGN PATENT DOCUMENTS

| | | |
|---|---|---|
| EP | 0757380 A3 | 12/1997 |
| EP | 1081766 A1 | 3/2001 |
| EP | 1361746 A1 | 11/2003 |
| JP | 9-219506 A | 8/1997 |
| JP | 2000231368 A | 8/2000 |
| JP | 2011253914 A | 12/2011 |
| WO | WO-8905039 A1 | 6/1989 |
| WO | WO-9746004 A1 | 12/1997 |
| WO | WO-0221573 | 3/2002 |

* cited by examiner

METAL-STRAPPED CCD IMAGE SENSORS

RELATED APPLICATION

This application claims the benefit of and priority to U.S. Provisional Patent Application No. 61/539,088, filed Sep. 26, 2011, the entire disclosure of which is hereby incorporated herein by reference.

TECHNICAL FIELD

The present invention relates, in various embodiments, to the construction, fabrication, and use of charge-coupled-device (CCD) image sensors.

BACKGROUND

Charge-coupled device (CCD) image sensors typically include an array of photosensitive areas that collect charge carriers in response to illumination. The collected charge is subsequently transferred from the array of photosensitive areas and converted to a voltage from which an image may be reconstructed by associated circuitry. FIG. 1 depicts a conventional interline CCD image sensor 100 that contains an array of photosensitive areas 110 (each of which may include or consist essentially of a photodiode, photodetector, photocapacitor, or photoconductor) arranged in columns. A vertical CCD (VCCD) 120 is disposed next to each column of photosensitive areas 110, and the VCCDs 120 are connected to a horizontal CCD (HCCD) 130. Following an exposure period, charge is transferred from the photosensitive areas 110 into the VCCDs 120, which subsequently shift the charge, row-by-row in parallel, into the HCCD 130. The HCCD then transfers the pixel charge serially to output circuitry, e.g., an output charge-sensing amplifier 140. The resulting data is then typically digitized, and the digitized image is displayed on a display or stored in a storage unit.

The amount of time required to propagate a voltage signal to the center of an interline CCD image sensor increases with increasing sensor size, because both the total gate capacitance for each vertical clock ($C_{V1}$, $C_{V2}$, ...) and the effective internal resistance for each vertical clock ($R_{V1}$, $R_{V2}$, ...) tend to increase as a function of the area of the image sensor. The vertical clock signals are carried upon gates running across the VCCDs (not shown in FIG. 1; see FIG. 2) that are sequentially biased to control the flow of pixel charge within the VCCDs. The characteristic time to propagate a voltage signal to the center of the image sensor may be expressed as $\tau_{V1}$, $\tau_{V2}$, ... where $\tau_{Vx} = \alpha R_{Vx} C_{Vx}$ and $\alpha$ is a numerical constant that depends on the details of the image sensor layout and the functional form used to describe the time-varying signal near the center of the imager. (V1, V2, etc. refer to vertical gate 1, vertical gate 2, etc.)

The vertical clock gates are typically formed of polysilicon, which when doped has a reasonably low resistivity (i.e., a length- and cross-sectional-area-independent measure of resistance to current flow), at least for small image sensors in which signals are not required to travel significant distances. One conventional technique that reduces the effective internal resistance for each vertical clock is "strapping" the polysilicon gates with metal lightshield in a column pattern, i.e., electrically connecting each gate to a metal line (having a lower resistivity) such that signals travelling along the gate encounter less resistance and propagate more quickly. In the standard configuration, the lightshield is electrically connected to a metal line near the top and bottom of the pixel array, as illustrated in FIG. 2.

FIG. 2 illustrates a conventional lightshield strapping pattern that reduces the internal resistance for the vertical clocks for an interline CCD image sensor 200. The figure depicts a "single-wire" layout in which metal strapping lines that reduce the resistance of the VCCD gates are connected to a bus line (which carries control signals for operating the VCCD phases) at the periphery of the imager, e.g., at the top or bottom. For illustrative purposes, image sensor 200 features three-phase VCCDs 205, although the same strapping pattern may be applied to CCDs with a different number of phases per pixel. The external V1, V2, and V3 biases (which control the movement of photocharge through the three "phases," or stages of current flow, of the VCCDs 205) are supplied to the pixel array on bus lines 210, 215, 220, respectively, which are typically formed of a metal such as aluminum or copper. The V1, V2, and V3 biases are electrically connected to phase strapping lines 225, 230, 235 (i.e., strapping lines for the VCCDs 205, where each individual strapping line carries only one phase bias) via contacts 240. While contacts 240 are illustrated as unitary contacts, they may also be formed as arrays of smaller discrete contacts.

The phase strapping lines 225, 230, 235 are typically formed of tungsten, TiW, or aluminum, and, in addition to providing low-resistance electrical conduction, are substantially opaque and thus block unwanted light from entering the VCCDs 205 (and may thus also be referred to as "lightshields"). Such light may generate deleterious additional optical signals within the VCCDs 205 (a phenomenon referred to as "smear"). As shown, the phase strapping lines 225, 230, 235 may be grouped in "bias groups," where multiple lines conducting the same phase signal neighbor each other. FIG. 2 illustrates bias groups of two. One advantage of increasing the number of phase strapping lines within a bias group is the reduction of the probability that a physical short-circuit within a particular phase strapping line (e.g., due to a processing defect or stray particle) results in an electrical short-circuit in the image sensor itself.

As shown, the phase strapping lines 225, 230, 235 are connected to the V1, V2, and V3 gates 245, 250, 255 (which are typically formed of polysilicon) with contacts 260. Some conventional sensors do not utilize phase strapping lines 225, 230, 235, and instead electrically contact the polysilicon gates 245, 250, 255 at their terminal ends at the left and right side of the pixel array. However, the resistance of the polysilicon gates 245, 250, 255 is typically one to two orders of magnitude greater than the resistance of the phase strapping lines 225, 230, 235, and this vastly increased resistance significantly reduces the frame rate (i.e., the rate at which images can be captured and read out of the device).

The design illustrated in FIG. 2 is often sufficient for small image sensors, in which control signals must propagate only short distances, because the relatively high resistivity of polysilicon gates and control lines has only a minor impact on frame rate. However, as image-sensor size increases, the increasing resistance of the phase strapping lines 225, 230, 235 impacts the characteristic response time, slows device operation, and reduces frame rate. Thus, there is a need for techniques for enabling further decreases in internal resistance in CCD image sensors, particular as sensor sizes continue to increase.

SUMMARY

Embodiments of the present invention decrease the internal resistance in CCD image sensors via the use of both horizontal and vertical strapping lines (disposed over the gate conductors that control the flow of photocharge through VCCDs)

that are both selectively connected to the bus lines carrying electrical control signals. The selective electrical connections enable the total resistance to a particular bias group to be substantially independent of the size of the image-sensor pixel array. Image sensors in accordance with embodiments of the invention typically feature multiple bus lines, each of which conducts a different phase-control signal to a different group of gate conductors. That is, bus line 1 conducts phase-control signal 1 to group 1 of the gate conductors, bus line 2 conducts phase-control signal 2 to group 2 of the gate conductors, etc., where phase-control signal 1 is different from phase-control signal 2 and group 1 of the gate conductors is different from and does not overlap with group 2 of the gate conductors.

In an aspect, embodiments of the invention feature an image sensor that includes an imaging array of photosensitive regions arranged in columns, a plurality of vertical CCDs (VCCDs) each associated with a column of photosensitive regions, and a horizontal CCD for receiving charge from the plurality of VCCDs. A plurality of groups of gate conductors for controlling transfer of charge within the VCCDs are disposed over the plurality of VCCDs, each group is responsive to a different phase-control signal, and each gate conductor has a first resistivity. The image sensor also includes a plurality of bus lines, each bus line conducting a different phase-control signal to a different group of gate conductors, and, disposed over the plurality of gate conductors in a first direction, a plurality of vertical strapping lines each (i) electrically connected to one of the bus lines and (ii) having a second resistivity less than the first resistivity. A plurality of horizontal strapping lines each (i) electrically connected to one of the bus lines and (ii) having a third resistivity less than the first resistivity extends over the plurality of gate conductors in a second direction not parallel to the first direction. A plurality of contacts each electrically connects a vertical strapping line to a horizontal strapping line to form a plurality of strapping grids each (i) including one or more vertical strapping lines and one or more horizontal strapping lines, (ii) electrically connected to a different bus line, and (iii) electrically connected to a different group of gate conductors.

Embodiments of the invention may include one or more of the following in any of a variety of combinations. Each gate conductor may include or consist essentially of polysilicon. Each vertical strapping line may include or consist essentially of a metal. Each horizontal strapping line may include or consist essentially of a metal. The plurality of vertical strapping lines and the plurality of horizontal strapping lines may collectively define a plurality of apertures, each photosensitive region being disposed within an aperture. Each photosensitive region may include or consist essentially of a photodiode, a photodetector, a photocapacitor, or a photoconductor. Each bus line may extend along two or more adjacent sides of the imaging array. Each of the vertical strapping lines and each of the horizontal strapping lines may be substantially opaque. The plurality of horizontal strapping lines may be disposed over the plurality of vertical strapping lines.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean ±10%, and in some embodiments, ±5%. The term "consists essentially of" means excluding other materials that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 3:
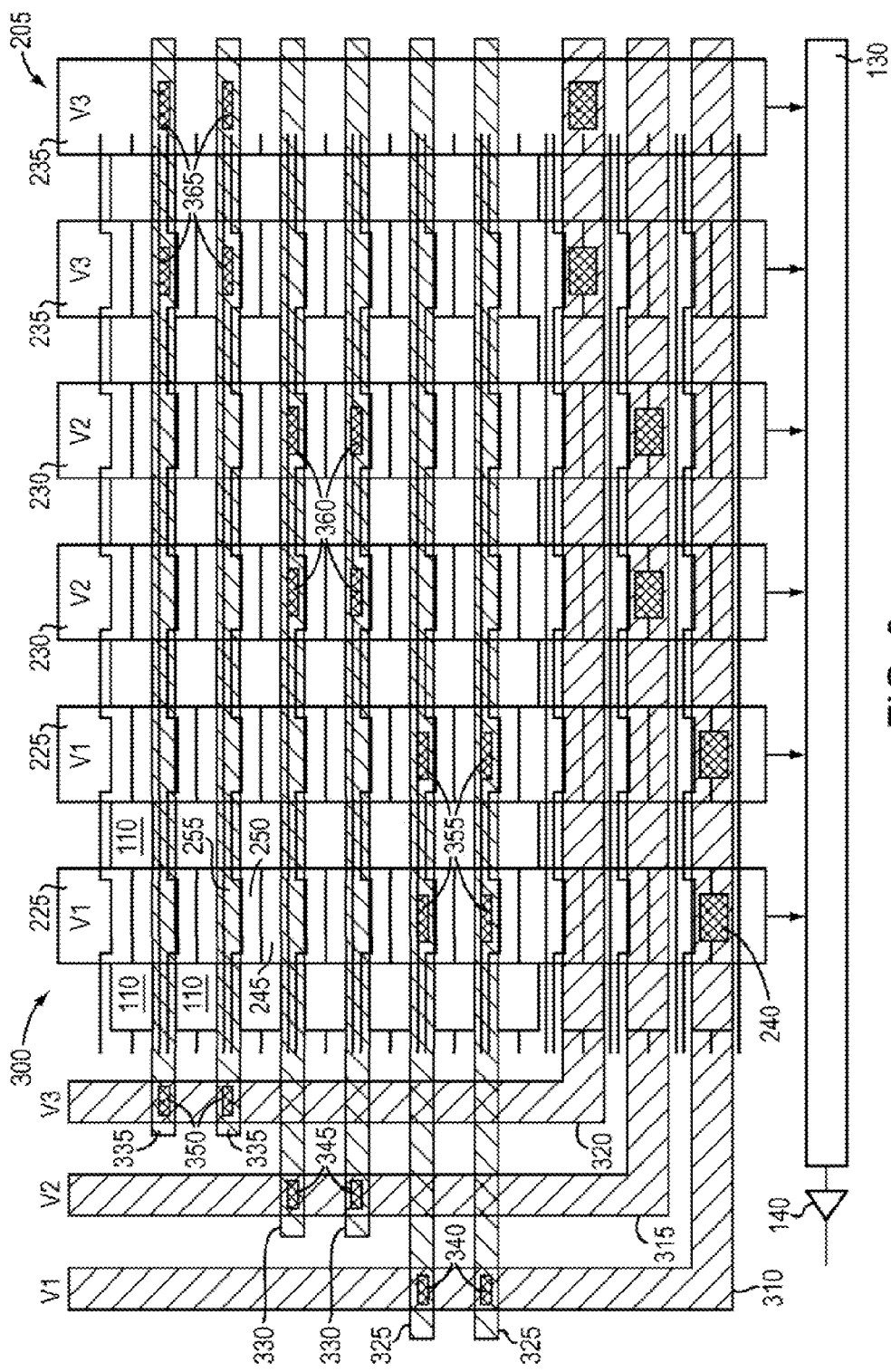
FIG. 3 is a schematic plan view of a CCD image sensor having both horizontal and vertical strapping lines in accordance with various embodiments of the invention.

FIG. 3 illustrates a simplified plan view of a CCD image sensor 300 having a wiring pattern in accordance with embodiments of the present invention. Image sensor 300 utilizes three-phase VCCDs 205, although the same strapping principles may be applied to CCDs with different numbers of phases per pixel. The external V1, V2, and V3 biases are supplied to the pixel array on bus lines 310, 315, 320, respectively. While the bus lines 310, 315, 320 are depicted as extending along portions of the bottom and left of the pixel array, in various embodiments the bus lines may run along different combinations of the four sides of the pixel-array periphery, e.g., the top side and the right side, or even all four sides.

As shown, image sensor 300 incorporates two different sets of strapping lines that typically include or consist essentially of a material having a lower resistivity than polysilicon, e.g., metal. Vertical strapping lines 225, 230, 235 carry phase biases V1, V2, and V3 vertically along VCCDs 205 and are substantially opaque, thereby substantially blocking stray light from reaching VCCDs 205. Contacts 240 electrically contact the vertical strapping lines 225, 230, 235 to bus lines 310, 315, 320. Horizontal strapping lines 325, 330, 335 carry phase biases V1, V2, V3 horizontally across the pixel array and VCCDs 205, and are electrically connected to the bus lines 310, 315, 320 via contacts 340, 345, 350. While contacts 240, 340, 345, 350 are illustrated as unitary contacts, they may also be formed as arrays of smaller discrete contacts. Typically the contact resistance of contacts 240, 340, 345, 350 is a negligible contribution to the total internal resistance within image sensor 300.

The internal resistance to phase signals V1, V2, and V3 may be substantially independent of imaging-array size via utilization of contacts that electrically connect horizontal and vertical strapping lines carrying the same phase signal. As shown, within the pixel array are contacts 355 that electrically connect V1 horizontal strapping lines 325 to V1 vertical strapping lines 225. Similarly, contacts 360 electrically connect V2 horizontal strapping lines 330 to V2 vertical strapping lines 230, and contacts 365 electrically connect V3 horizontal strapping lines 335 with V3 vertical strapping lines 235. (The contacts 355, 360, 365 enabling electrical contact between the horizontal and vertical strapping lines across the image sensor effectively create a "contact sheet," that includes the horizontal and vertical strapping lines, that extends across the pixel array and that has a substantially constant resistance as a function of pixel-array area.) The horizontal strapping lines and vertical strapping lines carrying the same phase signal and electrically connected via contacts 355, 360, or 365 form "strapping grids" each for the conduction of a different phase signal with low resistance, thereby enabling higher frame rate for image sensor 300.

Figure 1:
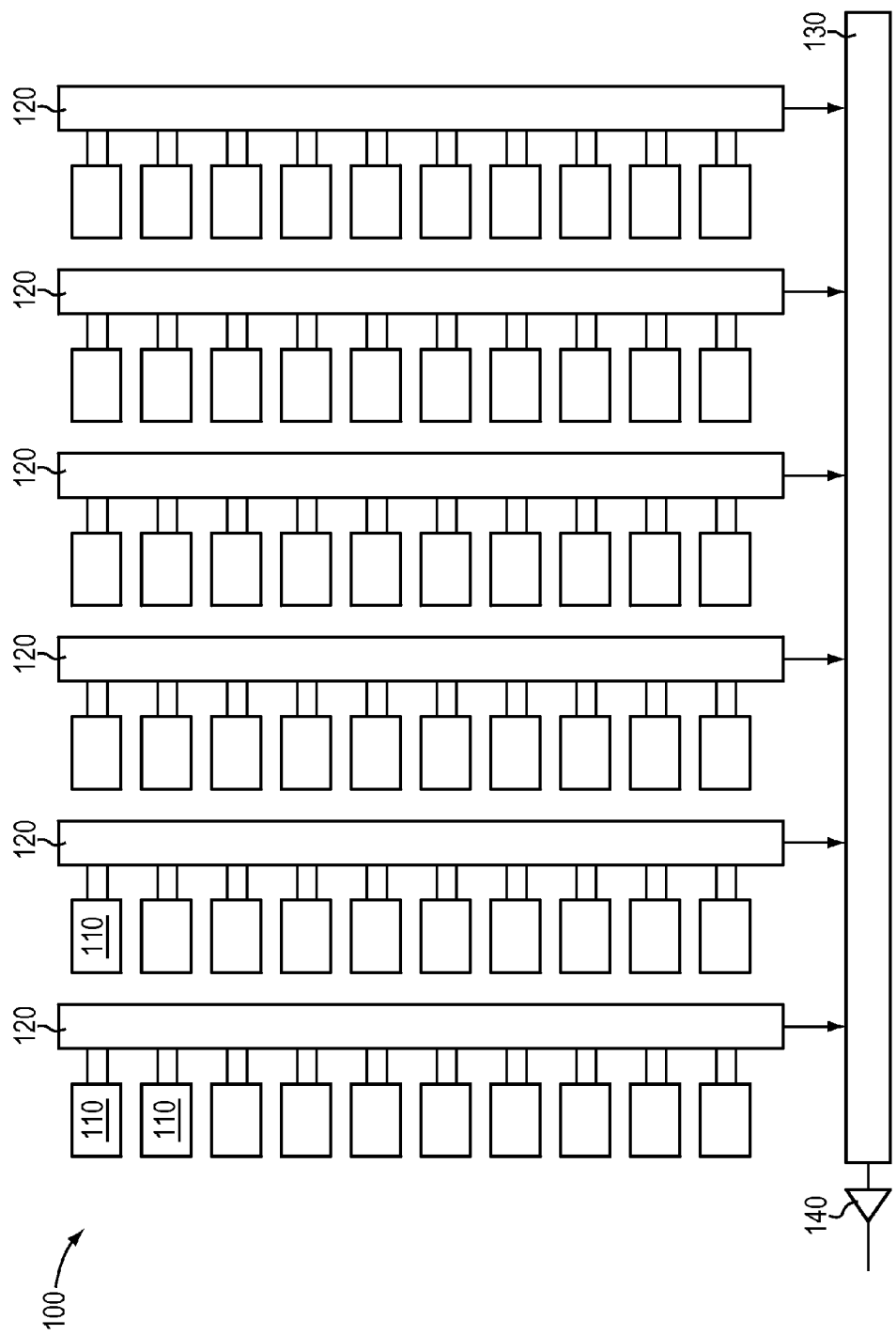
FIG. 1 is a block diagram of a conventional CCD image sensor.
Figure 2:
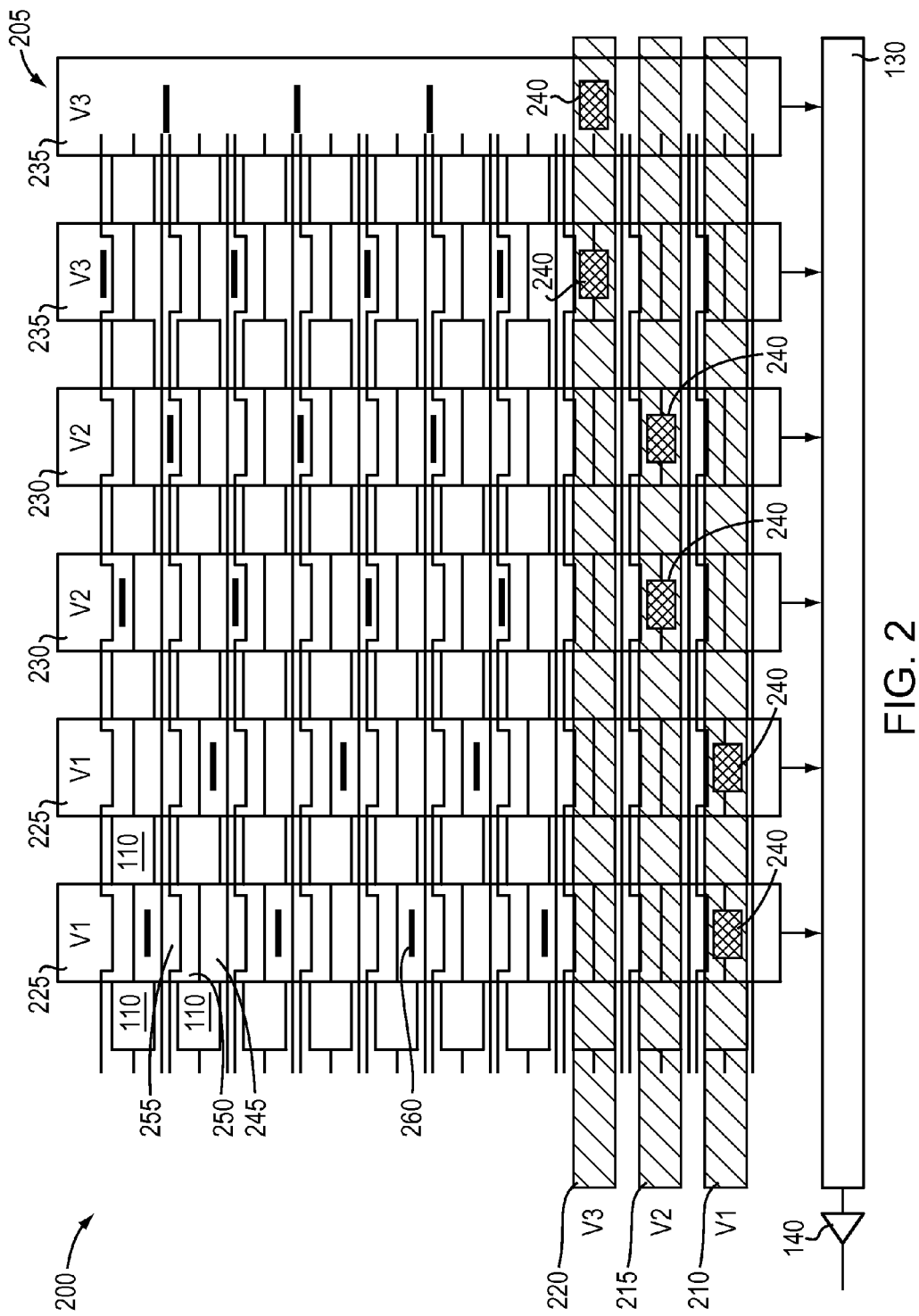
FIG. 2 is a schematic plan view of a conventional CCD image sensor with metal strapping lines on the VCCDs.

Typically, the design pattern for the contacts 325, 330, 335 is substantially randomized throughout the pixel array to minimize the formation of perceptible image artifacts due to the very slight response differences between pixels with and without contacts 325, 330, 335. For example, contacts 325, 330, 335 may be placed substantially randomly or in a variety of different patterns by utilizing principles described in U.S. Patent Application Publication No. 2012/0025275, filed on Jul. 29, 2010, the entire disclosure of which is incorporated by reference herein. Although not shown in FIG. 3 for clarity, the vertical strapping lines 225, 230, 235 are electrically connected to the V1, V2, and V3 gates 245, 250, and 255 via contacts 260 (as shown in FIG. 2).

As shown in FIG. 3, the vertical strapping lines 225, 230, 235 and the horizontal strapping lines 325, 330, 335 also may cooperatively define the aperture for the photodetector 110 for each pixel in the pixel array. Since the strapping lines typically include or consist essentially of a substantially optically opaque material (e.g., metal), incoming light enters only the photodetectors 110, dramatically reducing any smear signal. (The strapping lines are depicted in FIGS. 2 and 3 as partially or substantially transparent for clarity; typically the strapping lines are opaque.) In some embodiments of the invention, the vertical strapping lines 225, 230, 235 have a larger contribution to smear reduction (as they cover VCCDs 205 that might otherwise generate photocharge in response to incoming light), and thus the vertical strapping lines 225, 230, 235 are positioned vertically just above the gates 245, 250, 255 (gates as depicted in FIG. 2). In such embodiments, the horizontal strapping lines 325, 330, 335 may be disposed vertically above the vertical strapping lines 225, 230, 235 (e.g., with a dielectric layer disposed therebetween for electrical insulation), and the bus lines 310, 315, 320 may be disposed vertically above the horizontal strapping lines 325, 330, 335 (e.g., with a dielectric layer disposed therebetween for electrical insulation).

Figure 4:
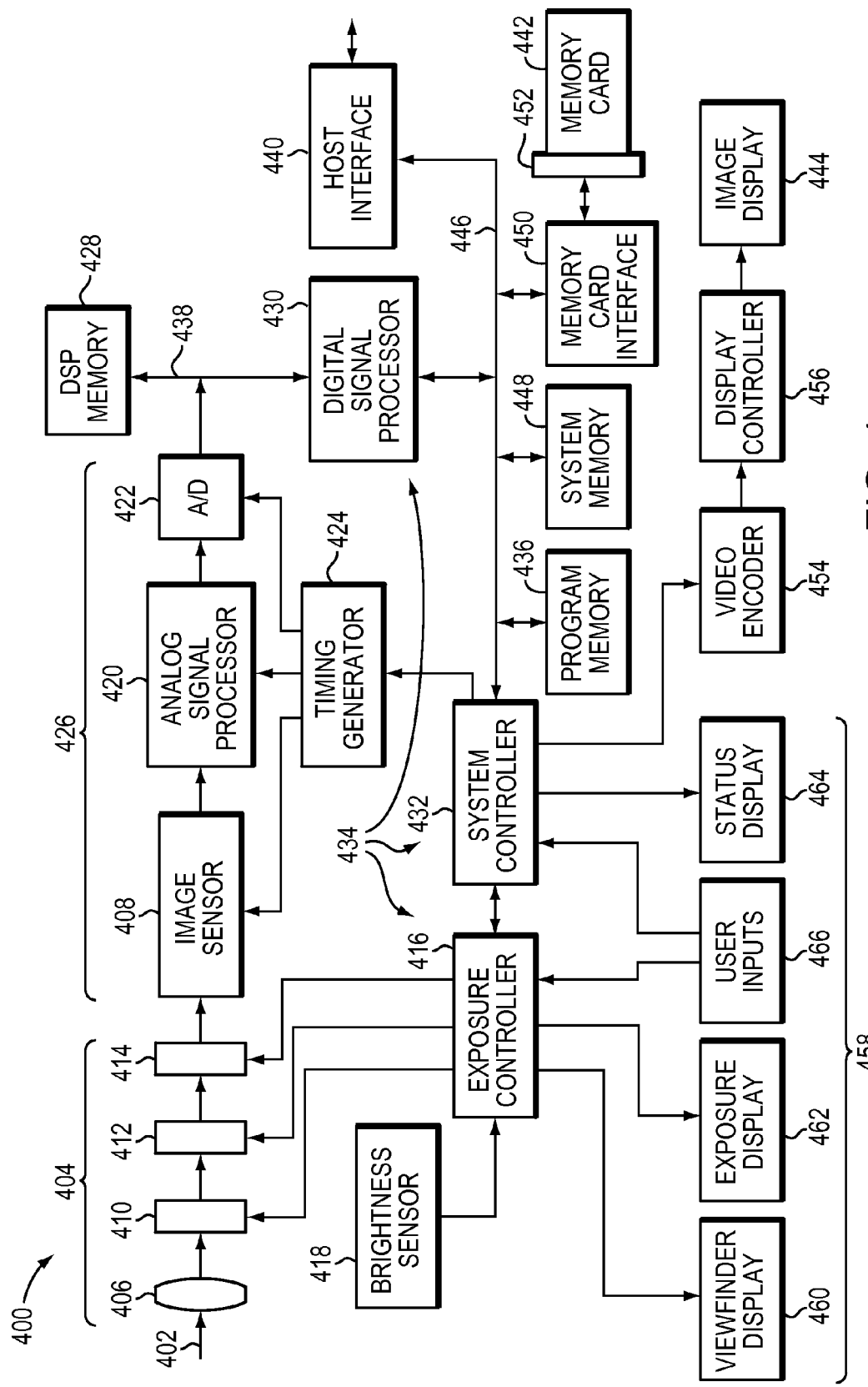
FIG. 4 is a block diagram of an image capture device incorporating a CCD image sensor in accordance with various embodiments of the invention.

Embodiments of the present invention may be utilized in a variety of different systems and devices, including, for example, digital cameras, digital video cameras, scanners, and telescopes. FIG. 4 illustrates an exemplary image capture device 400 in accordance with an embodiment of the invention. Image capture device 400 is implemented as a digital camera in FIG. 4.

Light 402 from a subject scene to be imaged is input to an imaging stage 404, where the light is focused by a lens 406 to form an image on a CCD image sensor 408 (which may features depicted in FIG. 3). Image sensor 408 converts the incident light to an electrical signal for each pixel thereof. The pixels of image sensor 408 may have a color filter array (not shown) applied thereover so that each pixel senses a portion of the imaging spectrum, as is known in the art.

The light passes through the lens 406 and a filter 410 prior to being sensed by image sensor 408. Optionally, light 402 passes through a controllable iris 412 and a mechanical shutter 414. The filter 410 may include or consist essentially of an optional neutral-density filter for imaging brightly lit scenes. An exposure controller 416 responds to the amount of light available in the scene, as metered by a brightness sensor block 418, and regulates the operation of filter 410, iris 412, shutter 414, and the integration time (or exposure time) of image sensor 408 to control the brightness of the image as sensed by image sensor 408.

This description of a particular camera configuration will be familiar to those skilled in the art, and it will be obvious that many variations and additional features are, or may be, present. For example, an autofocus system may be added, or the lenses may be detachable and interchangeable. It will be understood that embodiments of the present invention may be applied to any type of digital camera, where similar functionality is provided by alternative components. For example, the digital camera may be a relatively simple point-and-shoot digital camera, where shutter 414 is a relatively simple movable blade shutter, or the like, instead of a more complicated focal plane arrangement as may be found in a digital single-lens reflex camera. Embodiments of the invention may also be incorporated within imaging components included in simple camera devices such as those found in, e.g., mobile phones and automotive vehicles, which may be operated without controllable irises 412 and/or mechanical shutters 414. Lens 406 may be a fixed focal-length lens or a zoom lens.

As shown, the analog signal from image sensor 408 (corresponding to the amount of charge collected from one or more pixels) is processed by analog signal processor 420 and applied to one or more analog-to-digital (A/D) converters 422. A timing generator 424 produces various clocking signals to select rows, columns, or pixels in image sensor 408, to transfer charge out of image sensor 408, and to synchronize the operations of analog signal processor 420 and A/D converter 422. An image sensor stage 426 may include image sensor 408, analog signal processor 420, A/D converter 422, and timing generator 424. The resulting stream of digital pixel values from A/D converter 422 is stored in a memory 428 associated with a digital signal processor (DSP) 430.

DSP 430 is one of three processors or controllers in the illustrated embodiment, which also includes a system controller 432 and exposure controller 416. Although this partitioning of camera functional control among multiple controllers and processors is typical, these controllers or processors are combined in various ways without affecting the functional operation of the camera and the application of embodiments of the present invention. These controllers or processors may include or consist essentially of one or more DSP devices, microcontrollers, programmable logic devices, or other digital logic circuits. Although a combination of such controllers or processors has been described, it should be apparent that one controller or processor may be designated to perform all of the required functions. All of these variations may perform the same function and fall within the scope of various embodiments of the invention, and the term "processing stage" is utilized herein to encompass all of this functionality within one phrase, for example, as in processing stage 434 in FIG. 4.

In the illustrated embodiment, DSP 430 manipulates the digital image data in memory 428 according to a software program stored in a program memory 436 and copied to memory 428 for execution during image capture. DSP 430 executes the software necessary for image processing in an embodiment of the invention. Memory 428 may include or consist essentially of any type of random access memory, such as SDRAM. A bus 438, a pathway for address and data signals, connects DSP 430 to its related memory 428, A/D converter 422, and other related devices.

System controller 432 controls the overall operation of the image capture device 400 based on a software program stored in program memory 436, which may include or consist essentially of, e.g., flash EEPROM or other nonvolatile memory.

This memory may also be used to store image sensor calibration data, user setting selections, and/or other data to be preserved when the image capture device 400 is powered down. System controller 432 controls the sequence of image capture by directing exposure controller 416 to operate lens 406, filter 410, iris 412, and shutter 414 as previously described, directing timing generator 424 to operate image sensor 408 and associated elements, and directing DSP 430 to process the captured image data. After an image is captured and processed, the final image file stored in memory 428 may be transferred to a host computer via an interface 440, stored on a removable memory card 442 or other storage device, and/or displayed for the user on an image display 444.

A bus 446 includes a pathway for address, data and control signals, and connects system controller 432 to DSP 430, program memory 436, a system memory 448, host interface 440, memory card interface 450, and/or other related devices. Host interface 440 provides a high-speed connection to a personal computer or other host computer for transfer of image data for display, storage, manipulation, and/or printing. This interface may include or consist essentially of an IEEE 1394 or USB 2.0 serial interface or any other suitable digital interface. Memory card 442 is typically a Compact Flash card inserted into a socket 452 and connected to system controller 432 via memory card interface 450. Other types of storage that may be utilized include, without limitation, PC-Cards, MultiMedia Cards, and/or Secure Digital cards.

Processed images may be copied to a display buffer in system memory 448 and continuously read out via a video encoder 454 to produce a video signal. This signal may be output directly from image capture device 400 for display on an external monitor, or processed by a display controller 456 and presented on image display 444. This display is typically an active-matrix color liquid crystal display, although other types of displays may be utilized.

A user interface 458, including all or any combination of a viewfinder display 460, an exposure display 462, a status display 464, image display 444, and user inputs 466, may be controlled by one or more software programs executed on exposure controller 416 and system controller 432. User inputs 466 typically include some combination of buttons, rocker switches, joysticks, rotary dials, and/or touch screens. Exposure controller 416 operates light metering, exposure mode, autofocus and other exposure functions. System controller 432 manages the graphical user interface (GUI) presented on one or more of the displays, e.g., on image display 444. The GUI typically includes menus for making various option selections and review modes for examining captured images.

Exposure controller 416 may accept user inputs selecting exposure mode, lens aperture, exposure time (shutter speed), and exposure index or ISO speed rating and directs the lens and shutter accordingly for subsequent captures. Optional brightness sensor 418 may be employed to measure the brightness of the scene and provide an exposure meter function for the user to refer to when manually setting the ISO speed rating, aperture, and shutter speed. In this case, as the user changes one or more settings, the light meter indicator presented on viewfinder display 460 tells the user to what degree the image will be over- or under-exposed. In an alternate case, brightness information is obtained from images captured in a preview stream for display on image display 444. In an automatic exposure mode, the user changes one setting and exposure controller 416 automatically alters another setting to maintain correct exposure, e.g., for a given ISO speed rating when the user reduces the lens aperture, exposure controller 416 automatically increases the exposure time to maintain the same overall exposure.

The foregoing description of an image capture device will be familiar to one skilled in the art. It will be obvious that there are many variations that are possible and may be selected to reduce the cost, add features, or improve the performance thereof.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. An image sensor comprising:
an imaging array of photosensitive regions arranged in columns, the imaging array having a top side, a right side, a bottom side, and a left side;
a plurality of vertical charge coupled devices (VCCDs) each associated with a column of the photosensitive regions;
a horizontal CCD for receiving charge from the plurality of VCCDs;
disposed over the plurality of VCCDs, a plurality of groups of gate conductors for controlling transfer of charge within the plurality of VCCDs, each group being responsive to a different phase-control signal, and each gate conductor having a first resistivity;
a plurality of bus lines, each bus line conducting a different phase-control signal to a different group of gate conductors and extending along two or more adjacent sides of the imaging array;
disposed over the plurality of gate conductors in a first direction, a plurality of vertical strapping lines each (i) electrically connected to one of the bus lines on a first side of the imaging array and (ii) having a second resistivity less than the first resistivity;
extending over the plurality of gate conductors in a second direction not parallel to the first direction, a plurality of horizontal strapping lines each (i) electrically connected to one of the bus lines on a second side of the imaging array and (ii) having a third resistivity less than the first resistivity; and
a plurality of contacts each electrically connecting a vertical strapping line to a horizontal strapping line to form a plurality of strapping grids each (i) comprising one or more vertical strapping lines and one or more horizontal strapping lines, (ii) electrically connected to a different bus line, and (iii) electrically connected to a different group of gate conductors.

2. The image sensor of claim 1, wherein each of the gate conductors comprises polysilicon.

3. The image sensor of claim 1, wherein each of the vertical strapping lines comprises a metal.

4. The image sensor of claim 1, wherein each of the horizontal strapping lines comprises a metal.

5. The image sensor of claim 1, wherein the plurality of vertical strapping lines and the plurality of horizontal strapping lines collectively define a plurality of apertures, each photosensitive region being disposed within an aperture.

6. The image sensor of claim 1, wherein each of the photosensitive regions comprises a photodiode, a photo detector, a photo capacitor, or a photo conductor.

7. The image sensor of claim 1, wherein each of the vertical strapping lines and each of the horizontal strapping lines are substantially opaque.

8. The image sensor of claim 1, wherein the plurality of horizontal strapping lines are disposed over the plurality of vertical strapping lines.

9. An image sensor comprising:
   an imaging array of photosensitive regions arranged in columns, the imaging array having a top side, a right side, a bottom side, and a left side;
   a plurality of vertical charge coupled devices (VCCDs) each associated with a column of the photosensitive regions;
   a horizontal CCD for receiving charge from the plurality of VCCDs;
   disposed over the plurality of VCCDs, a plurality of groups of gate conductors for controlling transfer of charge within the plurality of VCCDs, each group being responsive to a different phase-control signal, and each gate conductor having a first resistivity;
   a plurality of bus lines, each bus line conducting a different phase-control signal and extending along two or more adjacent sides of the imaging array;
   a plurality of vertical strapping lines each electrically connected to a corresponding one of the plurality of bus lines on a first side of the imaging array;
   a plurality of horizontal strapping lines each electrically connected to a corresponding one of the plurality of bus lines on a second side of the imaging array; and
   a plurality of contacts each electrically connecting a vertical strapping line to a horizontal strapping line to form a plurality of strapping grids and electrically connected to a different group of gate conductors.

10. The image sensor of claim 9, wherein each of the plurality of horizontal strapping lines and each of the plurality of vertical strapping lines are made of a material having a lower resistivity than a resistivity of the gate conductor.

11. The image sensor of claim 10, wherein each of the gate conductors comprises polysilicon.

12. The image sensor of claim 10, wherein each of the vertical strapping lines comprises a metal.

13. The image sensor of claim 10, wherein each of the horizontal strapping lines comprises a metal.

14. The image sensor of claim 9, wherein the plurality of vertical strapping lines and the plurality of horizontal strapping lines collectively define a plurality of apertures, wherein each photosensitive region is disposed within an aperture.

15. The image sensor of claim 9, wherein each photosensitive region comprises a photodiode, a photo detector, a photo capacitor, or a photo conductor.

16. The image sensor of claim 9, wherein each of the vertical strapping lines and each of the horizontal strapping lines are substantially opaque.

17. The image sensor of claim 9, wherein the plurality of horizontal strapping lines are disposed over the plurality of vertical strapping lines.

18. An image sensor comprising:
   an imaging array of photosensitive regions arranged in columns, the imaging array having a top side, a right side, a bottom side, and a left side;
   a plurality of vertical charge coupled devices (VCCDs) each associated with a column of the photosensitive regions;
   a horizontal CCD for receiving charge from the plurality of VCCDs;
   a plurality of bus lines, each bus line conducting a different phase-control signal associated with the plurality of VCCDs and extending along two or more adjacent sides of the imaging array; and
   a grid of strapping lines over the imaging array comprising a plurality of vertical strapping lines each electrically connected to a corresponding one of the plurality of bus lines on a first side of the imaging array, and a plurality of horizontal strapping lines each electrically connected to a corresponding one of the plurality of bus lines on a second side of the imaging array, wherein the plurality of horizontal strapping lines is coupled to respective ones of the plurality of vertical strapping lines to form a strapping grid for an associated phase control-signal.

19. The image sensor of claim 18, wherein each of the vertical strapping lines and each of the horizontal strapping lines each comprises a metal.

20. The image sensor of claim 18, wherein the plurality of horizontal strapping lines are disposed over the plurality of vertical strapping lines.

* * * * *